United States Patent
Tang et al.

(10) Patent No.: US 10,606,299 B2
(45) Date of Patent: Mar. 31, 2020

(54) CIRCUIT FOR REGULATING LEAKAGE CURRENT IN CHARGE PUMP

(71) Applicant: Wuhan Xinxin Semiconductor Manufacturing Co., Ltd., Wuhan, Hubei (CN)

(72) Inventors: Yuan Tang, San Jose, CA (US); Bin Sheng, Hubei (CN); Byoung Kwon Cha, San Jose, CA (US); Yi Xu, Hubei (CN); Jen-Tai Hsu, San Jose, CA (US)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 16/226,168

(22) Filed: Dec. 19, 2018

(65) Prior Publication Data
US 2019/0318790 A1 Oct. 17, 2019

(30) Foreign Application Priority Data
Apr. 12, 2018 (CN) .......................... 2018 1 0327017

(51) Int. Cl.
| G05F 3/02 | (2006.01) |
| G05F 3/20 | (2006.01) |
| G11C 16/14 | (2006.01) |
| G11C 16/30 | (2006.01) |
| H02M 3/07 | (2006.01) |

(52) U.S. Cl.
CPC ................ *G05F 3/02* (2013.01); *G05F 3/205* (2013.01); *G11C 16/14* (2013.01); *G11C 16/30* (2013.01); *H02M 3/07* (2013.01)

(58) Field of Classification Search
CPC ........... G05F 3/02; G05F 3/205; G11C 16/30; G11C 16/14; G11C 5/146; H02M 3/07; H02M 1/14
See application file for complete search history.

(56) References Cited

U.S. PATENT DOCUMENTS

| 2009/0051415 A1 | 2/2009 | Botker et al. |
| 2013/0069711 A1* | 3/2013 | Chen ....................... H02M 3/07 327/536 |
| 2016/0005441 A1 | 1/2016 | Yang |
| 2017/0288531 A1* | 10/2017 | Ribeiro do Nascimento .............. H02M 3/07 |

FOREIGN PATENT DOCUMENTS

| CN | 103036411 A | 4/2013 |
| CN | 104953820 A | 9/2015 |

* cited by examiner

*Primary Examiner* — Ajay Ojha
(74) *Attorney, Agent, or Firm* — Muncy, Geissler, Olds & Lowe, P.C.

(57) ABSTRACT

A circuit for regulating a leakage current in a charge pump is disclosed. The circuit includes a bias voltage generating circuit and a first transistor, wherein: the bias voltage generating circuit generates a bias voltage that is proportional to a supply voltage; a gate of the first transistor is coupled to the bias voltage; the first transistor has a drain that is coupled to an output of the charge pump and a source that is grounded; a voltage the drain of the first transistor is proportional to the supply voltage; and a current flowing through the source and drain of the first transistor is proportional to the supply voltage that powers the charge pump.

19 Claims, 1 Drawing Sheet

CIRCUIT FOR REGULATING LEAKAGE CURRENT IN CHARGE PUMP

CROSS-REFERENCES TO RELATED APPLICATION

This application claims the priority of Chinese patent application number 201810327017.6, filed on Apr. 12, 2018, the entire contents of which are incorporated herein by reference.

TECHNICAL FIELD

The present invention relates to the field of semiconductor technology and, in particular, to a circuit for regulating a leakage current in a charge pump.

BACKGROUND

A charge pump circuit is a basic block for a flash memory and greatly affects the flash memory's program/erase speed. The continuous advancement of integrated circuit (IC) fabrication technology and our relentless pursuit for lower power consumption lead to the development of ICs powered by increasingly lower supply voltages.

On the other hand, in flash memories, program/erase operations of a cell still require relatively high voltages. In such a context, more and more importance is being attached to charge pump circuits in the continuously-developing IC domain. Currently, charge pumps have become a focus of research efforts in the field of flash memory design.

A charge pump, also known as a switched-capacitor voltage converter, is a kind of DC to DC converter that uses so-called "flying" or "pumping" capacitors (rather than inductors or transformers) for energetic charge storage to raise, lower an input voltage or to produce a negative voltage. An internal field effect transistors (FET) switch array of the charge pump controls transfer of electric charges among the capacitors in a certain manner (usually, uses clock signals to control the charge/discharge of the capacitors) so that the input voltage is raised (or reduced) in a certain way to a desired output level.

A leakage current in a charge pump can regulate its output voltage to a certain extent, and in most cases, the leakage current is maintained constant. However, when the charge pump is powered with a supply voltage varying in a wide range, the leakage current would no longer be able to regulate the output voltage well.

SUMMARY OF THE INVENTION

It is an object of the present invention to provide a circuit for regulating a leakage current in a charge pump so as to overcome the problem with conventional charge pumps that a widely varying supply voltage will weaken the regulating ability of a leakage current in the charge pump.

To this end, the present invention provides a circuit for regulating a leakage current in a charge pump, comprising a bias voltage generating circuit and a first transistor, wherein:
the bias voltage generating circuit generates a bias voltage that is proportional to a supply voltage;
the first transistor has a gate coupled to the bias voltage and a source that is grounded;
the first transistor has a drain coupled to an output of the charge pump, a voltage at the drain of the first transistor being proportional to the supply voltage; and
a current between the source and drain of the first transistor is proportional to the supply voltage that powers the charge pump.

Optionally, in the circuit, the first transistor may be an N-channel field-effect transistor.

Optionally, the circuit may further comprise a second transistor, wherein:
the second transistor has a gate coupled to the supply voltage, a source connected to the drain of the first transistor and a drain connected to the output of the charge pump.

Optionally, in the circuit, the second transistor may be an N-channel field-effect transistor.

Optionally, in the circuit, a breakdown voltage between the source and drain of the second transistor may be higher than a breakdown voltage between the source and drain of the first transistor.

Optionally, in the circuit, the bias voltage generating circuit may comprise a third transistor and a fourth transistor, wherein:
the third transistor has a gate that is grounded, a source coupled to the supply voltage and a drain connected to a drain of the fourth transistor; and
the fourth transistor has a gate connected both to the drain of the fourth transistor and the gate of the first transistor and a source that is grounded.

Optionally, in the circuit, the third transistor may be a P-channel field-effect transistor, with the fourth transistor implemented as an N-channel field-effect transistor.

Optionally, in the circuit, the gate of the first transistor may be connected to the drains of the third and fourth transistors Optionally, in the circuit, the voltage at the drain of the first transistor may be equal to the supply voltage minus a threshold voltage of the first transistor.

Optionally, in the circuit, the supply voltage may range from 1.6 V to 3.9 V.

Optionally, in the circuit, the current flowing through the source-drain of the first transistor may range from 10 µA to 70 µA.

To this end, the present invention provides a circuit for regulating a leakage current in a charge pump, comprising a first transistor, a third transistor and a fourth transistor, wherein:
the first transistor has a gate connected to drains of the third and fourth transistors for receiving a bias voltage that is proportional to a supply voltage;
the first transistor has a drain coupled to an output of the charge pump and a source that is grounded, a voltage at the drain of the first transistor being proportional to the supply voltage;
the third transistor has a gate that is grounded, a source coupled to the supply voltage and the drain connected to the drain of the fourth transistor;
the fourth transistor has a gate connected both to the drain of the fourth transistor and the gate of the first transistor and a source that is grounded; and
a current between the source and drain of the first transistor is proportional to the supply voltage that powers the charge pump.

Optionally, in the circuit, the first transistor is an N-channel field-effect transistor, the third transistor is a P-channel field-effect transistor and the fourth transistor is an N-channel field-effect transistor.

Optionally, the circuit may further comprise a second transistor, wherein:

the second transistor has a gate coupled to the supply voltage, a source connected to the drain of the first transistor and a drain connected to the output of the charge pump.

Optionally, in the circuit, the second transistor is an N-channel field-effect transistor.

Optionally, in the circuit, a breakdown voltage between the source and drain of the second transistor is higher than a breakdown voltage between the source and drain of the first transistor.

Optionally, in the circuit, the voltage at the drain of the first transistor is equal to the supply voltage minus a threshold voltage of the first transistor.

Optionally, in the circuit, the supply voltage ranges from 1.6 V to 3.9 V.

Optionally, in the circuit, a current flowing through the source and drain of the first transistor ranges from 10 µA to 70 µA.

In the circuit of the present invention, the current flowing through the source and drain of the first transistor (which is a leakage current) is proportional to the supply voltage. When the supply voltage VCC is at a higher level, the charge pump will have a stronger output ability. As a result, more electric charges will be present at its output, creating a higher output voltage of the charge pump. However, as the leakage current increases with the supply voltage, the higher level of the supply voltage will also lead to drainage of more electric charges from the output of the charge pump. As a result, the output voltage of the charge pump will experience smaller fluctuations and allow regulation of the output voltage in a large extent such that an output power of the charge pump is reduced. On contrary, when the supply voltage VCC is at a lower level, the output ability of the charge pump will be weaker. Therefore, fewer electric charges will be present at the output of the charge pump, resulting in a lower output voltage thereof. At the same time, the leakage current will be lower at a lower level of the supply voltage, which will lead to drainage of fewer electric charges from the output of the charge pump. As a result, the output voltage of the charge pump will also experience smaller fluctuations. As such, fluctuations in the output voltage can be controlled within a narrow range, regardless of whether the supply voltage is high or low.

DETAILED DESCRIPTION

The present invention will be described below in further detail with reference to the accompanying drawings and some specific embodiments. Features and advantages of the invention will be more apparent from the following detailed description, and from the appended claims. It is noted that the figures are provided in a very simplified form not necessarily presented to scale, with the only intention to facilitate convenience and clarity in explaining the embodiments of the invention.

The core concept of the present invention is to provide a circuit for regulating a leakage current in a charge pump so as to overcome the problem with conventional charge pumps that a widely varying supply voltage will weaken the regulating ability of a leakage current in the charge pump.

To this end, the present invention provides a circuit for regulating a leakage current in a charge pump, comprising a bias voltage generating circuit and a first transistor. The bias voltage generating circuit generates a bias voltage that is proportional to a supply voltage. A gate of the first transistor is coupled to the bias voltage. The first transistor has a drain that is coupled to an output of the charge pump and a source that is grounded. A voltage at the drain of the first transistor is proportional to the supply voltage. A current flowing through the source and drain of the first transistor is proportional to the supply voltage that powers the charge pump.

Figure 1:
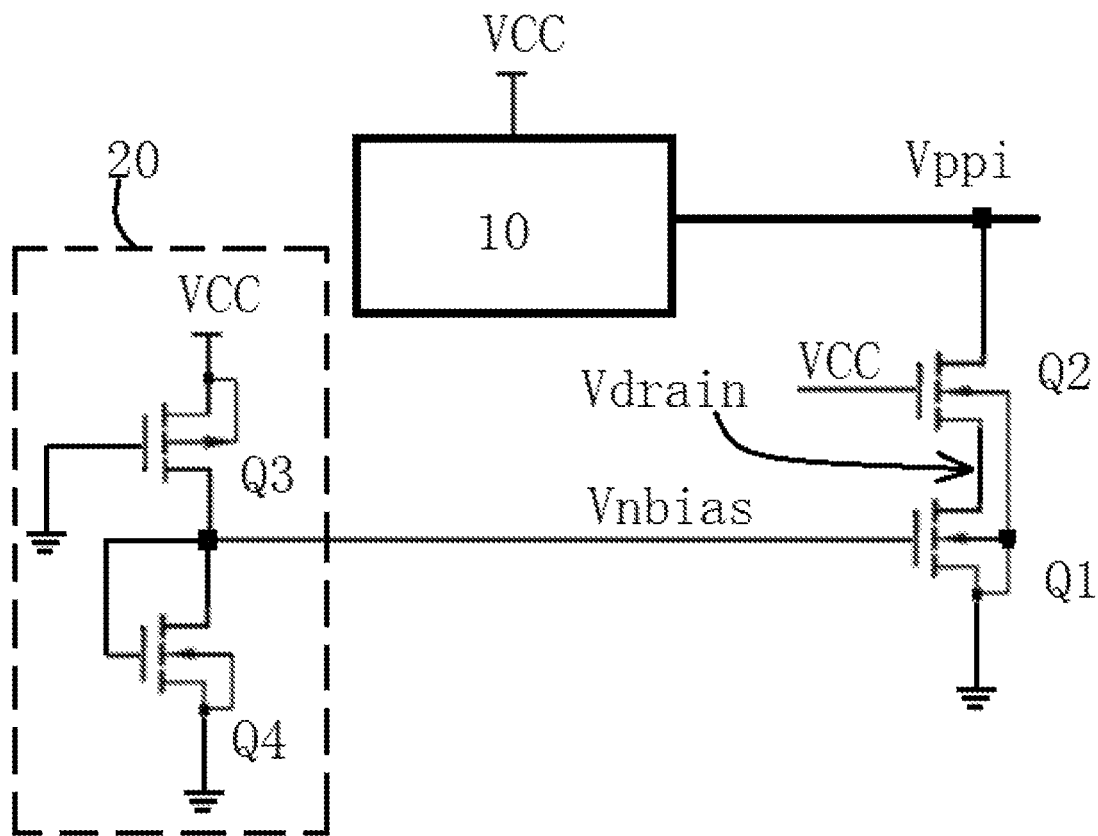
FIG. 1 is a schematic illustration of a circuit for regulating a leakage current in a charge pump according to an embodiment of the present invention.

As shown in FIG. 1, a circuit for regulating a leakage current in a charge pump according to an embodiment of the present invention includes a bias voltage generating circuit 20 and a first transistor Q1. The bias voltage generating circuit 20 generates a bias voltage Vnbias that is proportional to a supply voltage VCC. A gate of the first transistor Q1 is coupled to the bias voltage Vnbias. The first transistor Q1 has a drain that is coupled to an output of the charge pump 10 and a source that is grounded. A voltage Vdrain at the drain of the first transistor is proportional to the supply voltage VCC. A current i_leak flowing through the source-drain of the first transistor Q1 is proportional to the supply voltage VCC that powers the charge pump 10.

In particular, in the circuit for regulating a leakage current in a charge pump, the first transistor Q1 may be an N-channel field-effect transistor. The circuit may further include a second transistor Q2 having a gate coupled to the supply voltage VCC, a source connected to the drain of the first transistor Q1 and a drain connected to the output of the charge pump 10. The second transistor Q2 may be an N-channel field-effect transistor and a breakdown voltage between the source and drain of the second transistor may be higher than a breakdown voltage of the source and drain of the first transistor.

Further, in the circuit, in the circuit for regulating a leakage current in a charge pump, the bias voltage generating circuit may include a third transistor Q3 and a fourth transistor Q4. The third transistor Q3 has a gate that is grounded, a source coupled to the supply voltage VCC and a drain connected to a drain of the fourth transistor Q4. The fourth transistor Q4 has a gate connected to the drain of the fourth transistor Q4 and the gate of the first transistor Q1, and a source that is grounded. The third transistor Q3 may be a P-channel field-effect transistor, with the fourth transistor Q4 being implemented as an N-channel field-effect transistor.

Figure 2:
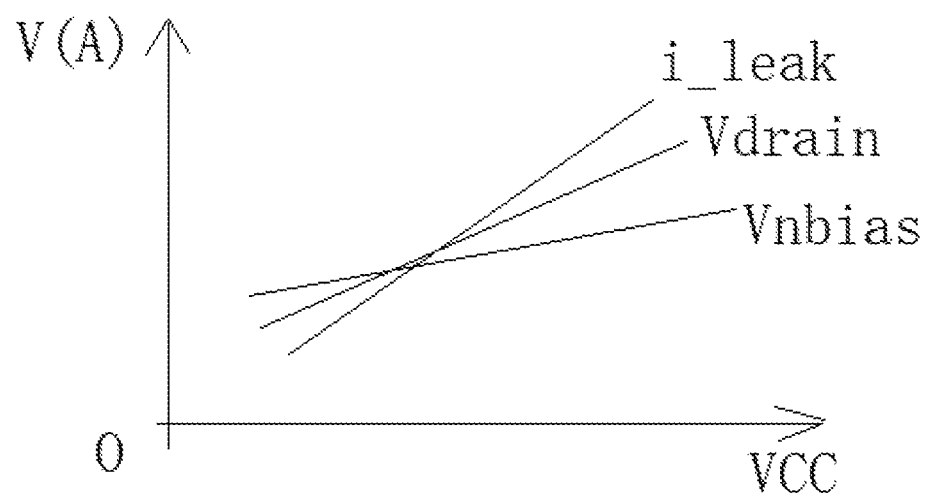
FIG. 2 schematically illustrates waveforms of a leakage current, a bias voltage and a voltage at a drain of a first transistor according to an embodiment of the present invention.

As shown in FIGS. 1 to 2, in the circuit for regulating a leakage current in a charge pump, the voltage Vdrain at the drain of the first transistor Q1 may be equal to the supply voltage VCC minus a threshold voltage of the first transistor Q1. The supply voltage may range from 1.6 V to 3.9 V, with the current i_leak flowing through the source and drain of the first transistor Q1 accordingly ranging from 10 µA to 70 µA.

In the circuit of the present invention, the current i_leak flowing through the source and drain of the first transistor Q1 (which is a leakage current i_leak) is proportional to the supply voltage VCC. When the supply voltage VCC is at a higher level, the charge pump will have a stronger output ability. As a result, more electric charges will be present at its output Vppi, creating a higher output voltage of the charge pump 10. However, as the leakage current i_leak increases with the supply voltage VCC, the higher level of the supply voltage will also lead to drainage of more electric charges from the output Vppi of the charge pump 10. As a result, the output voltage of the charge pump 10 will experience smaller fluctuations and allow regulation of the output voltage in a large extent such that an output power of the charge pump 10 is reduced. On contrary, when the supply voltage VCC is at a lower level, the output ability of the charge pump 10 will be weaker. Therefore, fewer electric charges will be present at the output Vppi of the charge pump 10, resulting in a lower output voltage thereof. At the same time, the leakage current i_leak will be lower at a lower level of the supply voltage VCC, which will lead to drainage of fewer electric charges from the output Vppi of the charge pump. As a result, the output voltage of the charge pump will also experience smaller fluctuations. As such, fluctuations in the output voltage can be controlled within a narrow range, regardless of whether the supply voltage VCC is high or low.

In summary, various configurations of the circuit for regulating a leakage current in a charge pump have been detailed in the above embodiments. Of course, the present invention includes, but not limited to, the configurations disclosed above, and any and all modifications made to these configurations are considered to fall within the scope of the invention. Those skilled in the art can extend the inventive ideas in many ways.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. A circuit for regulating a leakage current in a charge pump, comprising a bias voltage generating circuit and a first transistor, wherein:
    the bias voltage generating circuit generates a bias voltage that is proportional to a supply voltage;
    the first transistor has a gate coupled to the bias voltage and a source that is grounded;
    the first transistor has a drain coupled to an output of the charge pump, a voltage at the drain of the first transistor being proportional to the supply voltage; and
    a current between the source and drain of the first transistor is proportional to the supply voltage that powers the charge pump.

2. The circuit of claim 1, wherein the first transistor is an N-channel field-effect transistor.

3. The circuit of claim 1, further comprising a second transistor,
    the second transistor having a gate coupled to the supply voltage, a source connected to the drain of the first transistor and a drain connected to the output of the charge pump.

4. The circuit of claim 3, wherein the second transistor is an N-channel field-effect transistor.

5. The circuit of claim 3, wherein a breakdown voltage between the source and drain of the second transistor is higher than a breakdown voltage between the source and drain of the first transistor.

6. The circuit of claim 1, wherein the bias voltage generating circuit comprises a third transistor and a fourth transistor, wherein:

the third transistor has a gate that is grounded, a source coupled to the supply voltage and a drain connected to a drain of the fourth transistor; and
the fourth transistor has a gate connected both to the drain of the fourth transistor and the gate of the first transistor and a source that is grounded.

7. The circuit of claim 6, wherein the third transistor is a P-channel field-effect transistor and the fourth transistor is an N-channel field-effect transistor.

8. The circuit of claim 6, wherein the gate of the first transistor is connected to the drains of the third and fourth transistors.

9. The circuit of claim 1, wherein the voltage at the drain of the first transistor is equal to the supply voltage minus a threshold voltage of the first transistor.

10. The circuit of claim 1, wherein the supply voltage ranges from 1.6 V to 3.9 V.

11. The circuit of claim 1, wherein a current flowing through the source and drain of the first transistor ranges from 10 µA to 70 µA.

12. A circuit for regulating a leakage current in a charge pump, comprising a first transistor, a third transistor and a fourth transistor, wherein:
    the first transistor has a gate connected to drains of the third and fourth transistors for receiving a bias voltage that is proportional to a supply voltage;
    the first transistor has a drain coupled to an output of the charge pump and a source that is grounded, a voltage at the drain of the first transistor being proportional to the supply voltage; the third transistor has a gate that is grounded, a source coupled to the supply voltage and the drain connected to the drain of the fourth transistor;
    the fourth transistor has a gate connected both to the drain of the fourth transistor and the gate of the first transistor and a source that is grounded; and
    a current between the source and drain of the first transistor is proportional to the supply voltage that powers the charge pump.

13. The circuit of claim 12, wherein the first transistor is an N-channel field-effect transistor, the third transistor is a P-channel field-effect transistor and the fourth transistor is an N-channel field-effect transistor.

14. The circuit of claim 12, further comprising a second transistor,
    the second transistor having a gate coupled to the supply voltage, a source connected to the drain of the first transistor and a drain connected to the output of the charge pump.

15. The circuit of claim 14, wherein the second transistor is an N-channel field-effect transistor.

16. The circuit of claim 14, wherein a breakdown voltage between the source and drain of the second transistor is higher than a breakdown voltage between the source and drain of the first transistor.

17. The circuit of claim 12, wherein the voltage at the drain of the first transistor is equal to the supply voltage minus a threshold voltage of the first transistor.

18. The circuit of claim 12, wherein the supply voltage ranges from 1.6 V to 3.9 V.

19. The circuit of claim 12, wherein a current flowing through the source and drain of the first transistor ranges from 10 µA to 70 µA.

* * * * *